(12) United States Patent
Hamada et al.

(10) Patent No.: US 10,170,730 B2
(45) Date of Patent: Jan. 1, 2019

(54) VACUUM EVAPORATION DEVICE AND METHOD THEREOF, AND ORGANIC LIGHT-EMITTING DISPLAY PANEL

(71) Applicants: Shanghai Tianma AM-OLED Co., Ltd., Shanghai (CN); Tianma Micro-Electronics Co., Ltd., Shenzhen (CN)

(72) Inventors: Yuji Hamada, Shanghai (CN); Jinghua Niu, Shanghai (CN); Wei He, Shanghai (CN); Honggang Yan, Shanghai (CN); Lei Lv, Shanghai (CN); Xiangcheng Wang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/486,722

(22) Filed: Apr. 13, 2017

(65) Prior Publication Data
US 2017/0222191 A1   Aug. 3, 2017

(30) Foreign Application Priority Data
Nov. 28, 2016   (CN) .......................... 2016 1 1074944

(51) Int. Cl.
*H01L 51/00*   (2006.01)
*H01L 51/56*   (2006.01)
(Continued)

(52) U.S. Cl.
CPC ............ *H01L 51/56* (2013.01); *C23C 14/044* (2013.01); *C23C 14/06* (2013.01); *C23C 14/24* (2013.01);
(Continued)

(58) Field of Classification Search
USPC .......................................................... 438/46
See application file for complete search history.

(56) References Cited

U.S. PATENT DOCUMENTS

2011/0073843 A1* 3/2011 Bonucci .............. H01L 51/5052
257/40

FOREIGN PATENT DOCUMENTS

CN      101523632 A    9/2009
CN      101965653 A    2/2011
(Continued)

*Primary Examiner* — Timor Karimy
(74) *Attorney, Agent, or Firm* — Anova Law Group, PLLC

(57) ABSTRACT

A vacuum evaporation device, a vacuum evaporation method, and an organic light-emitting display panel are provided. The vacuum evaporation device comprises at least a first evaporation chamber. The first evaporation chamber includes at least one first organic material evaporation source and at least one first metal evaporation source. The at least one first organic material evaporation source is configured to evaporate a first organic material, and the at least one first metal evaporation source is configured to evaporate a first metal material. The at least one first organic material evaporation source and the at least one first metal evaporation source are controlled to perform evaporation simultaneously to generate blend doping of a first organic material and a first metal material on a substrate disposed within the first evaporation chamber.

13 Claims, 10 Drawing Sheets

(51) Int. Cl.
*C23C 14/24* (2006.01)
*H01L 51/50* (2006.01)
*C23C 14/04* (2006.01)
*C23C 14/06* (2006.01)

(52) U.S. Cl.
CPC ...... *H01L 51/0002* (2013.01); *H01L 51/5076* (2013.01)

(56) References Cited

FOREIGN PATENT DOCUMENTS

| | | | |
|---|---|---|---|
| CN | 103374700 A | | 10/2013 |
| CN | 103429783 A | | 12/2013 |
| CN | 103594487 A | | 2/2014 |
| CN | 106103790 A | | 11/2016 |
| JP | 106103790 | * | 11/2016 |
| KR | 1020080074552 A | | 8/2008 |

* cited by examiner

VACUUM EVAPORATION DEVICE AND METHOD THEREOF, AND ORGANIC LIGHT-EMITTING DISPLAY PANEL

CROSS-REFERENCES TO RELATED APPLICATIONS

This application claims priority of Chinese Patent Application No. 201611074944.9, filed on Nov. 28, 2016, the entire contents of which are hereby incorporated by reference.

FIELD OF THE DISCLOSURE

The present disclosure generally relates to the field of display technology and, more particularly, relates to a vacuum evaporation device, a method thereof, and an organic light-emitting display panel.

BACKGROUND

An organic light-emitting diode (OLED), also known as an organic electroluminescent device, has a basic structure including an anode, a cathode, and a light-emitting layer corresponding to each pixel region. When voltages are applied to an anode and a cathode, holes and electrons injected from the anode and the cathode may move to the light-emitting layer. The two charge carriers (i.e., holes and electrons) may be recombined in the light-emitting layer to generate an exciton (also known as an electron-hole pair), and the exciton in the material of the light-emitting layer may transit from an excited state to a ground state to emit light.

To improve the electron transport capability, an OLED may further include an electron transport layer disposed between the cathode and the light-emitting layer. The electron transport layer may enhance the electron mobility of the electron transport layer by doping an organic material with a metallic element. In existing technologies, the major organic material of the electron transport layer and the metal-ion containing complex are often co-evaporated. However, the ligand in the metal-ion containing complex has no contribution to the electron transport capability, thus imposing restrictions on the enhancement of the electron mobility of the electron transport layer.

According to the present disclosure, a vacuum evaporation device implementing co-evaporation of an organic material evaporation source and a metal evaporation source is highly desired, such that the co-evaporation of the organic material evaporation source and the metal evaporation source may be realized. Further, the evaporation rates of the organic material evaporation source and the metal evaporation source may be precisely controlled.

The disclosed vacuum evaporation devices and methods, and organic light-emitting display panels are directed to solving at least partial problems set forth above and other problems.

BRIEF SUMMARY OF THE DISCLOSURE

One aspect of the present disclosure provides a vacuum evaporation device. The vacuum evaporation device comprises at least a first evaporation chamber. The first evaporation chamber includes at least one first organic material evaporation source and at least one first metal evaporation source. The at least one first organic material evaporation source is configured to evaporate a first organic material, and the at least one first metal evaporation source is configured to evaporate a first metal material. The at least one first organic material evaporation source and the at least one first metal evaporation source are controlled to perform evaporation simultaneously to generate blend doping of a first organic material and a first metal material on a substrate disposed within the first evaporation chamber.

Another aspect of the present disclosure provides a vacuum evaporation method. The vacuum evaporation method comprises providing a substrate in a first evaporation chamber, and disposing at least one first organic material evaporation source and at least one first metal evaporation source in the first evaporation chamber. The vacuum evaporation method further includes controlling the at least one first organic material evaporation source and the at least one first metal evaporation source to evaporate simultaneously, thereby realizing blend doping of a first organic material and a first metal material. The at least one first organic material evaporation source and the at least one first metal evaporation source are arranged opposite to the substrate. Further, during an evaporation process, the at least one first organic material evaporation source and the at least one first metal evaporation source are controlled to move from an edge of the substrate to another edge of the substrate.

Another aspect of the present disclosure provides an organic light-emitting display panel formed by a vacuum evaporation method. The vacuum evaporation method comprises providing a substrate in a first evaporation chamber, and disposing at least one first organic material evaporation source and at least one first metal evaporation source in the first evaporation chamber. The vacuum evaporation method further includes controlling the at least one first organic material evaporation source and the at least one first metal evaporation source to evaporate simultaneously, thereby realizing blend doping of a first organic material and a first metal material. The at least one first organic material evaporation source and the at least one first metal evaporation source are arranged opposite to the substrate. Further, during an evaporation process, the at least one first organic material evaporation source and the at least one first metal evaporation source are controlled to move from an edge of the substrate to another edge of the substrate.

Other aspects of the present disclosure can be understood by those skilled in the art in light of the description, the claims, and the drawings of the present disclosure.

BRIEF DESCRIPTION OF THE DRAWINGS

To make more clearly the explanation of technical solution in embodiments of the present disclosure, drawings needed in the embodiments or current techniques are briefly illustrated hereinafter. Apparently, the accompanying drawings only correspond to some embodiments of the present disclosure, and it is possible for those ordinarily skilled in the art to derive other drawings from the accompanying drawings without creative effort.

DETAILED DESCRIPTION

Figure 1:
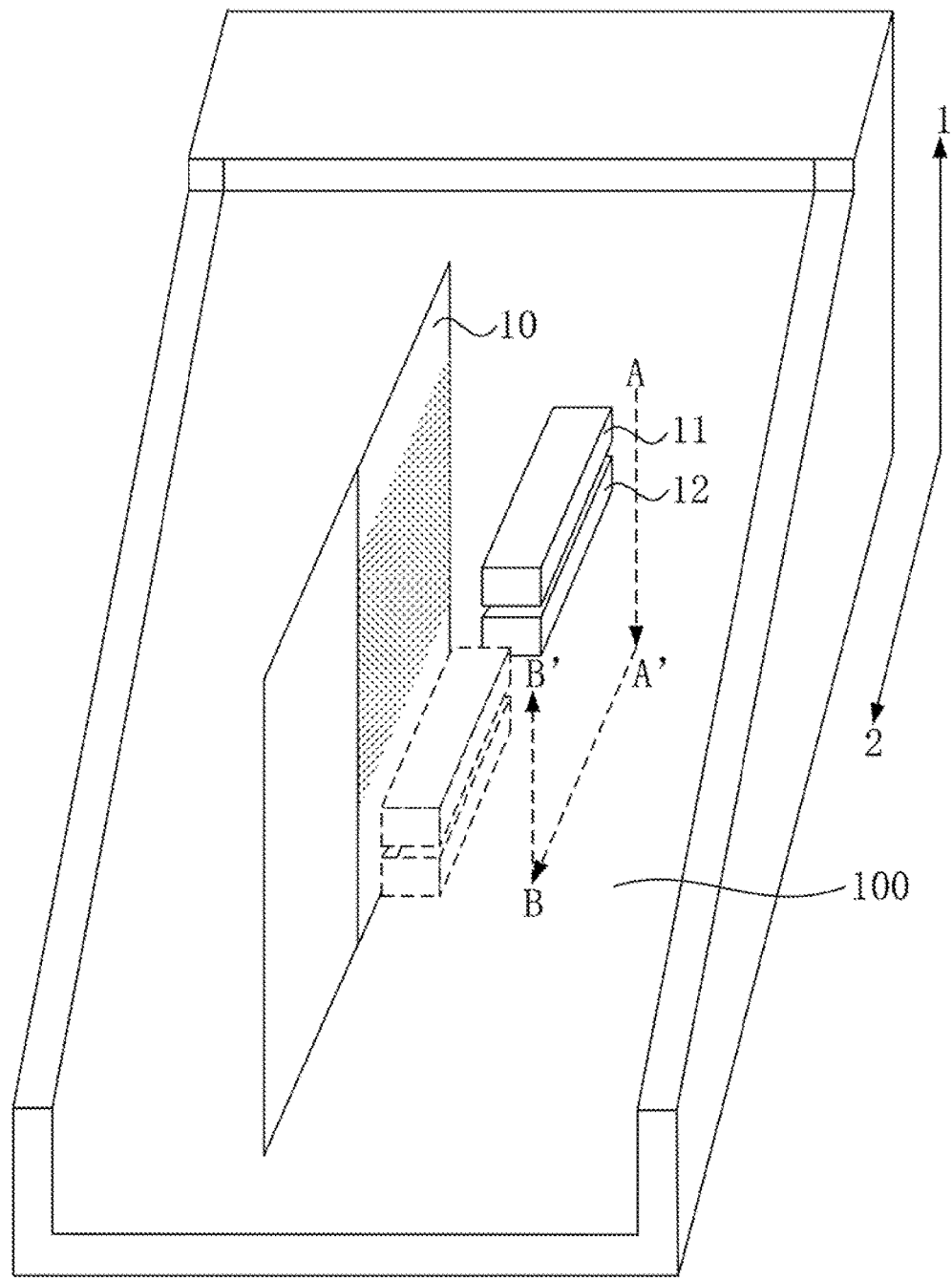
FIG. 1 illustrates a partial schematic inner view of an exemplary vacuum chamber of a vacuum evaporation device according to embodiments of the present disclosure.

The present disclosure will be described in detail hereinafter with reference to accompanying drawings and embodiments. It should be understood that the specific embodiments described herein are only used to illustrate the present disclosure, and are not limiting of the present disclosure. In addition, it should be noted that, for ease of description, the accompanying drawings only illustrate a part of, rather than entire structures.

As discussed above, an existing OLED often includes an electron transport layer, and the electron transport layer is often made of an organic material doped with a metallic element. In existing technologies, the major organic material of the electron transport layer and a metal-ion containing complex are often co-evaporated. However, the ligand(s) in the metal-ion containing complex has no contribution to the electron transport capability, thus imposing restrictions on the enhancement of the electron mobility of the electron transport layer.

Directed to solving at least partial problems set forth above and other problems, the present disclosure provide an improved vacuum evaporation device. The vacuum evaporation device comprises at least a first evaporation chamber including at least one first organic material evaporation source and at least one first metal evaporation source.

The at least one first organic material evaporation source is configured to evaporate a first organic material, and the at least one first metal evaporation source is configured to evaporate a first metal material. The at least one first organic material evaporation source and the at least one metal evaporation source may be controlled to perform evaporation simultaneously, thereby implementing the blend doping of the first organic material and the first metal material.

An evaporation source used in vacuum evaporation may often include a crucible to seal an evaporation material, a nozzle to eject the evaporation material, a heater to heat the crucible, and a housing to hold the crucible, the nozzle, and the heater, etc. When performing vacuum evaporation, the evaporation material may evaporate or sublimate from the crucible heated by the heater, and the vaporized evaporation material may be ejected from the nozzle towards a to-be-evaporated substrate or film layer, thereby forming a desired film layer.

When a film layer comprising a blend of two or more different materials needs to be evaporated in the same chamber, a co-evaporation technique may be applied. That is, a plurality of evaporation sources may be configured in the same vacuum chamber, and crucibles in different evaporation sources may hold different materials.

According to the present disclosure, by configuring at least one first organic material evaporation source and at least one first metal evaporation source in the first evaporation chamber, the blend evaporation of the first organic material and the first metal material may be realized. In particular, the first organic material evaporation chamber is configured to evaporate the first organic material, and the first metal evaporation source is configured to evaporate a first metal material. Further, the at least one first organic material evaporation source and the at least one first metal evaporation source may be controlled to evaporate simultaneously.

Technical solutions in embodiments of the present disclosure will be described in hereinafter with reference to accompanying drawing in embodiments of the present disclosure. Based on embodiments of the present disclosure, other embodiments obtainable by those ordinarily skilled in the art shall all fall within the protection scope of the present disclosure.

Figure 2:
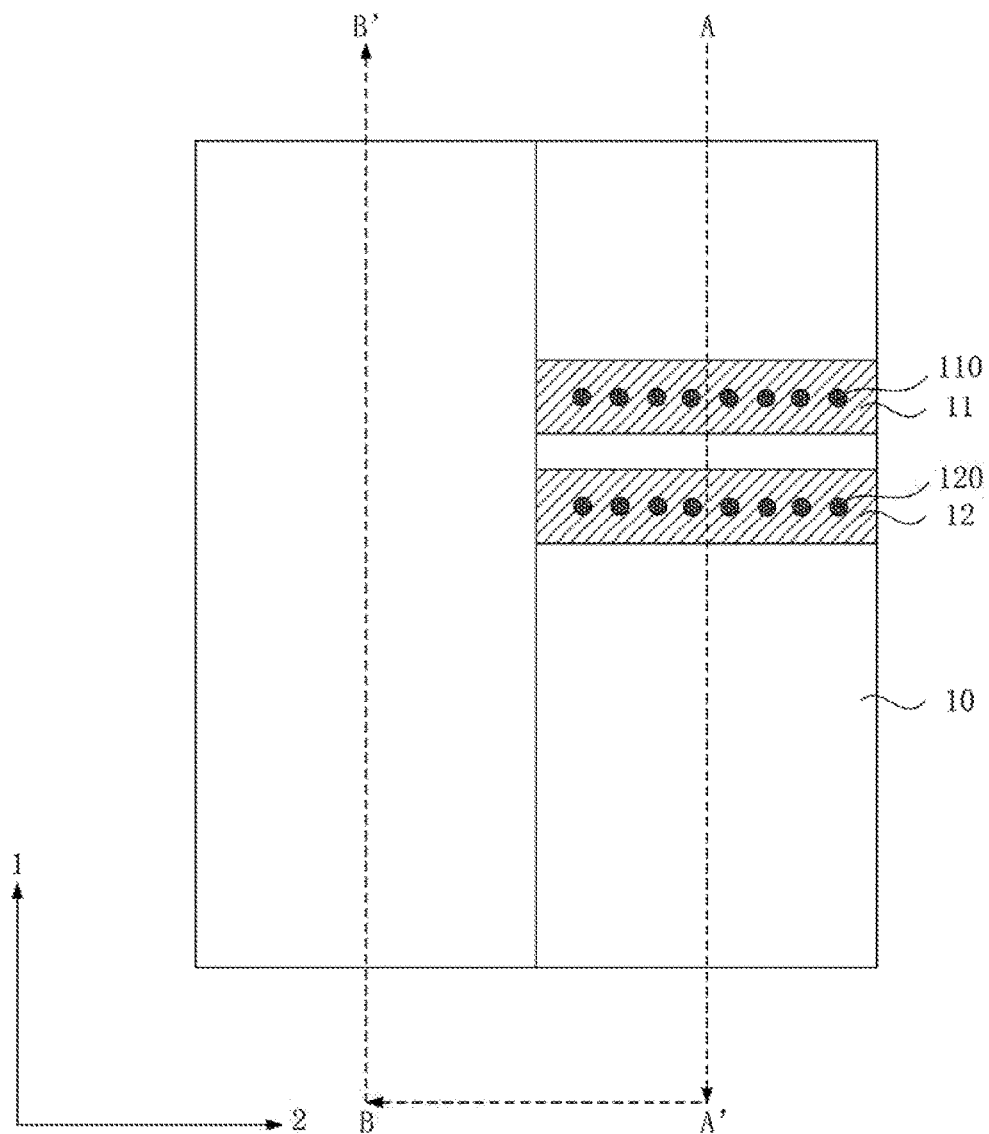
FIG. 2 illustrates a schematic view of an exemplary configuration and a moving path of evaporation sources in a vacuum evaporation device illustrated in FIG. 1 according to embodiments of the present disclosure.

FIG. 1 illustrates a partial schematic inner view of an exemplary vacuum chamber of a vacuum evaporation device according to embodiments of the present disclosure. FIG. 2 illustrates a schematic view of an exemplary configuration and a moving path of evaporation sources in a vacuum evaporation device illustrated in FIG. 1 according to embodiments of the present disclosure.

As shown in FIG. 1, a first evaporation chamber 100 maintaining vacuum may include a substrate 10, a first organic material evaporation source 11, and a first metal evaporation source 12. A front surface of substrate 10 facing towards the first organic material evaporation source 11 and the first metal evaporation source 12 may be in a rectangular or square shape. The first organic material evaporation source 11 and the first metal evaporation source 12 may be both cuboid evaporation sources. More specifically, the first organic material evaporation source 11 may be configured to spray a first organic material, and the first metal evaporation source 12 may be configured to spray a first metal.

Optionally, the front surface of the substrate 10 may be in a circular shape, or other regular and irregular shapes. Optionally, the first organic material evaporation source 11 and the first metal evaporation source 12 may have a linear-like or point-like shape, etc. The present disclosure is not limited thereto.

Further, as shown in FIG. 1, a first direction 1 may be a moving direction of the first organic material evaporation source 11 and the first metal evaporation source 12, and a second direction 2 may be an extension direction of the first organic material evaporation source 11 and the first metal evaporation source 12. The first direction 1 and the second direction 2 may be directions defined for illustrative purposes, and may not represent actual placement directions of products protected by the present disclosure in practical applications.

Further, the substrate 10 may be divided into a left side region and a right side region. For example, the right side region may be defined to be a region having the same length along the second direction 2 as the first organic material evaporation source 11 and the first metal evaporation source 12. In one embodiment, as shown in FIG. 1, the length of the cuboid or linear-like evaporation sources (i.e., the first organic material evaporation source 11 and the first metal evaporation source 12) may be half of the length of the substrate 10 along the second direction 2. That is, the right side region may have the same area as the left side region.

Optionally, the length of the first organic material evaporation source 11 and the first metal evaporation source 12 may be configured to be the same as the length of the substrate 10 along the second direction 2. That is, the substrate 10 may not be divided into the left side region and the right side region, but be treated as a whole. The present disclosure is not intended to limit the lengths of the first organic material evaporation source 11 and the first metal evaporation source 12, and other situations may also exist.

For example, the substrate 10 may include a first region on the left, a second region in the middle, and a third region on the right. The lengths of the first region, the second region and the third region along the second direction 2 may be the same, and may further equal to the length of the first organic material evaporation source 11 and the first metal evaporation source 12. That is, the length of the first organic material evaporation source 11 and the first metal evaporation source 12 may be configured to be one third of the length of the substrate 10 along the second direction 2.

Optionally, the first organic material evaporation source 11 and the first metal evaporation source 12 may be arranged in parallel along the moving direction (i.e., the first direction 1), and may move simultaneously along the same direction. By configuring the two evaporation sources (i.e., the first organic material evaporation source 11 and the first metal evaporation source 12) to move simultaneously along the same direction, a film layer formed at an initial evaporation location may be ensured to be relatively uniform. Further, each position on the substrate 10 may be ensured to form a film layer comprising a blend of the first organic material and the first metal material.

In one embodiment, as shown in FIG. 1, the vacuum evaporation device may only include one first evaporation chamber 100, and the one first evaporation chamber may include one first organic material evaporation source 11 and one first metal evaporation source 12. However, the present disclosure is not intended to limit the numbers of the first evaporation chambers 100, the first organic material evaporation sources 11, and the first metal evaporation sources 12 in the vacuum evaporation device. For example, the vacuum evaporation device may include a plurality of first evaporation chambers 100, and in each first evaporation chamber 100, a plurality of first organic material evaporation sources 11 and a plurality of first metal evaporation sources may be disposed according to specific requirements of fabrication processes.

FIG. 2 illustrates a schematic inner view of a vacuum chamber observed from a side of evaporation sources. As shown in FIG. 2, when the vacuum evaporation device evaporates the first organic material and the first metal material simultaneously, the first organic material evaporation source 11 and the first metal evaporation source 12 may move upwards and downwards along the first direction 1.

More specifically, the first organic material evaporation source 11 may spray the first organic material via one or more first nozzle 110, and the first metal evaporation source 12 may spray the first metal material via one or more second nozzle 120. Further, the first organic material evaporation source 11 and the first metal evaporation source 12 may perform evaporation of the two materials (i.e., the first organic material and the first metal material) along the same direction simultaneously, such that a film layer comprising a blend of the first organic material and the first metal may be formed.

The numbers and configuration manners of the first nozzles 110 and the second nozzles 120 are for illustrative purposes. For example, in one embodiment, as shown in FIG. 2, eight first nozzles 110 may be arranged in a horizontal direction (i.e., the second direction 2) in the first organic material evaporation source 11, and eight first nozzles 120 may be arranged in a horizontal direction in the first metal evaporation source 12. Optionally, the nozzles (e.g., the first nozzles 110 and the second nozzles 120) of the first organic material evaporation source 11 and the first metal evaporation source 12 may have other numbers or configuration manners, and the present disclosure is not intended to be limiting.

Further, in one embodiment, the first organic material evaporation source 11 and the first metal evaporation source 12 may have standby positions extending along the second direction at a top right side of the substrate 10, and move simultaneously along an AA' direction. Accordingly, a film layer comprising a blend of the first organic material and the first metal material may be formed on the right side region of the substrate 10 by evaporation. Further, the two evaporation sources (i.e., the first organic material evaporation source 11 and the first metal evaporation source 12) may move along an A'B direction to a left side region of the substrate 10, and further move along a BB' direction simultaneously. Accordingly, a film layer comprising a blend of the first organic material and the first metal material may be formed on the left side region of the substrate 10 by evaporation.

Thus, by using the first organic material evaporation source 11 and the first metal evaporation source 12, a film layer comprising a blend of the first organic material and the first metal material may be formed on the entire substrate 10, and the formed film layer may be relatively uniform.

According to the present disclosure, the standby positions may be configured at the top right side of the substrate 10 along the second direction 2 for illustrative purposes only. Other standby positions may also be appropriate for use. When different standby positions are selected, the moving path of the two evaporation sources may be changed correspondingly, as long as the two evaporation sources are able to form a uniform film layer comprising a blend of the first organic material and the first metal material on the entire substrate 10.

Figure 3:
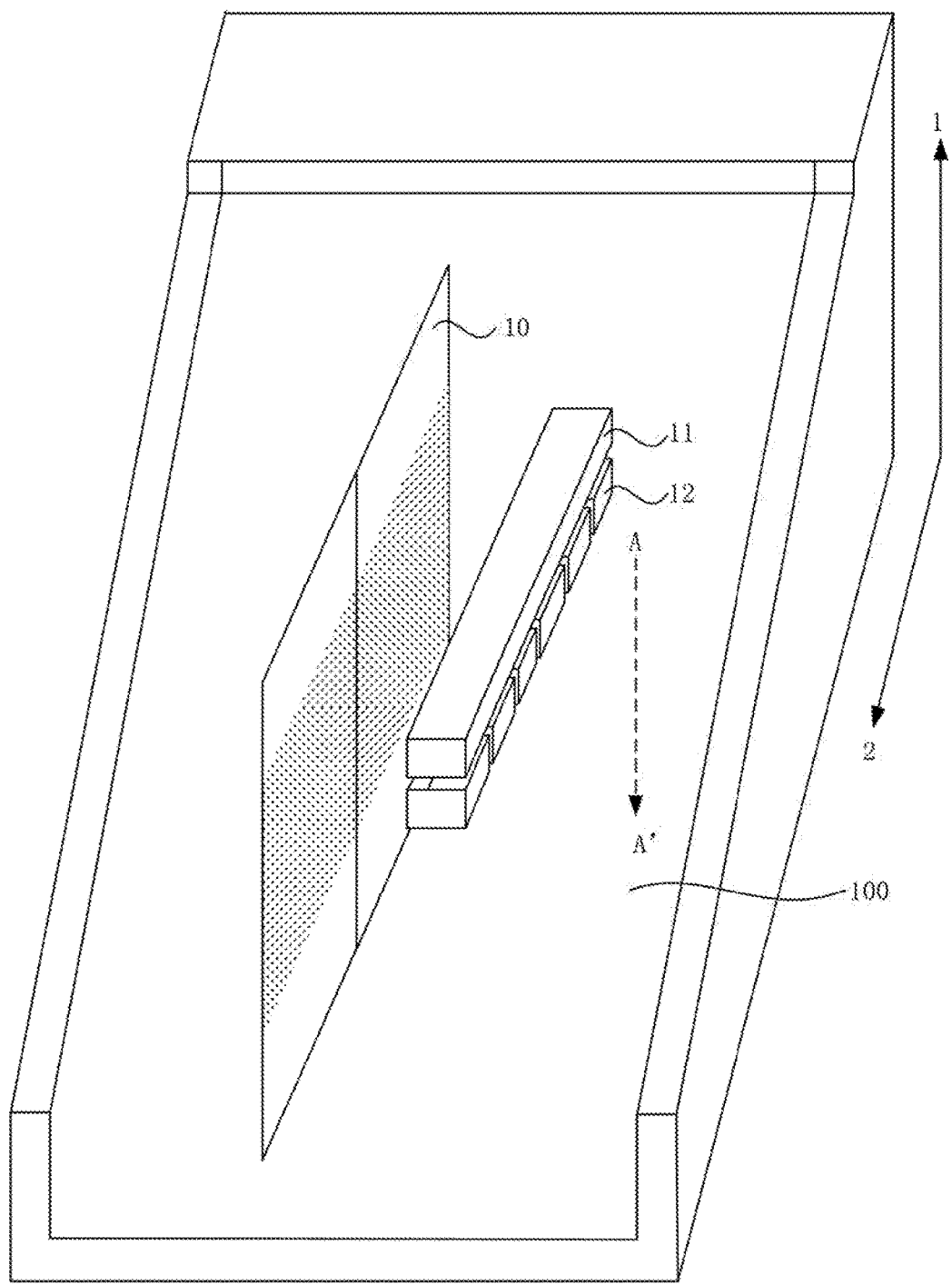
FIG. 3 illustrates a partial schematic inner view of another exemplary vacuum chamber of a vacuum evaporation device according to embodiments of the present disclosure.

FIG. 3 illustrates a partial schematic inner view of a vacuum chamber of another exemplary vacuum evaporation device according to embodiments of the present disclosure. As shown in FIG. 3, the first evaporation chamber 100 maintaining a vacuum may include the substrate 10, the first organic material evaporation source 11, and a plurality of first metal evaporation sources 12. Different from aforementioned embodiments, the first organic evaporation source 11 may be a linear-like or cuboid evaporation source, and the plurality of first metal evaporation sources 12 may be point-like evaporation sources. For example, the plurality of first metal evaporation sources 12 may be in a cubic shape with a very small dimension.

Further, along the second direction 2, the length of the first organic material evaporation source 11 and length of the substrate 10 may be configured to be the same. Optionally, as shown in FIG. 3, the number of the first metal evaporation sources 12 may be configured to be six, and the six first metal evaporation sources 12 may be arranged in a direction parallel to an extension direction of the first organic material evaporation source 11.

Further, the point-like first metal evaporation source 12 may use a small opening to eject an evaporation material, thereby forming a film layer. More specifically, when the first metal evaporation source 12 evaporates, vapor modules of the first metal material may be ejected in various directions to form a uniform film layer. Further, the diameter of the first metal evaporation source 12 may be very small and thus may be neglected and treated as a dot with respect to the distance from the first metal evaporation source 12 to the substrate. To more clearly illustrate an evaporation process of the point-like first metal evaporation source 12, the point-like first metal evaporation source is depicted in a shape denoted by a reference number 12 in FIG. 3. The present disclosure is, however, not intended to limit the specific shape of the point-like first metal evaporation source 12.

Figure 4:
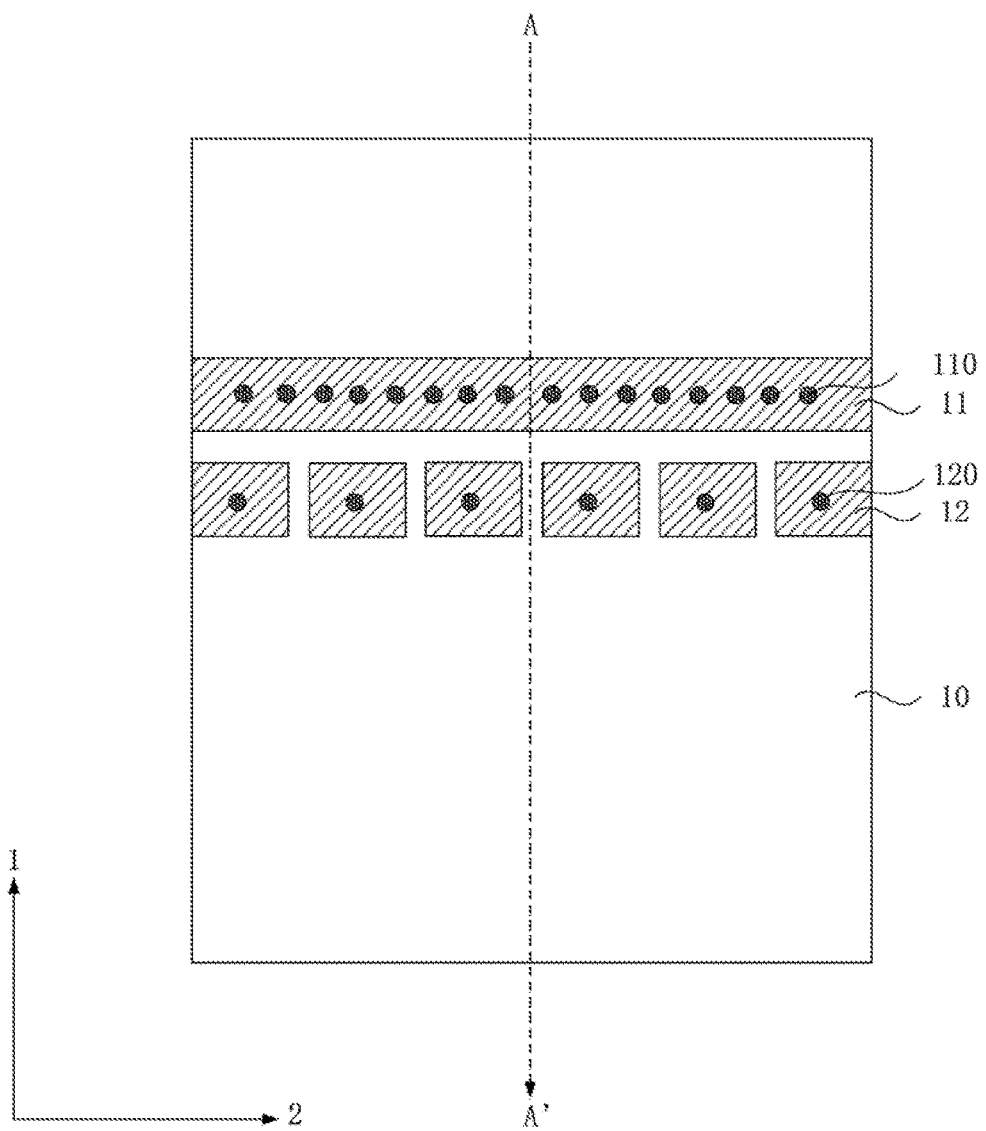
FIG. 4 illustrates a schematic view of another exemplary configuration and a moving path of evaporation sources in a vacuum evaporation device illustrated in FIG. 3 according to embodiments of the present disclosure.

FIG. 4 illustrates a schematic view of another exemplary configuration and a moving path of evaporation sources in a vacuum evaporation device illustrated in FIG. 3 according to embodiments of the present disclosure. FIG. 4 is a diagram observed from an evaporation source side. When the vacuum evaporation device evaporates the first organic material and the first metal material simultaneously, the first organic material evaporation source 11 and the plurality of first metal evaporation source 12 arranged in a direction parallel to the extension direction of the first organic material evaporation source 11 may move along the AA' direction.

Further, the first organic material evaporation source 11 may spray the first organic material via the first nozzle 110, and the first metal evaporation source 12 may spray the first metal material via the second nozzle 120. The first organic material evaporation source 11 and the plurality of first metal evaporation sources 12 may perform evaporation of the two materials simultaneously along the same direction, thereby forming a film layer comprising a blend of the first organic material and the first metal material.

In one embodiment, the first organic material evaporation source 11 and the plurality of first metal evaporation sources 12 may be disposed at standby positions extending along the second direction 2 at an edge side of the substrate 10. Accordingly, two ends of the first organic material evaporation source 11 and the plurality of first metal evaporation sources 12 may be aligned with the two sides of the substrate 10 in the first direction 1. The first organic material evaporation source 11 and the plurality of first metal evaporation sources 12 may be controlled to move simultaneously along the AA' direction, thereby forming a film layer comprising a blend of the first organic material and the first metal material on the entire substrate 10, and the formed film layer may be relatively uniform.

Figure 5:
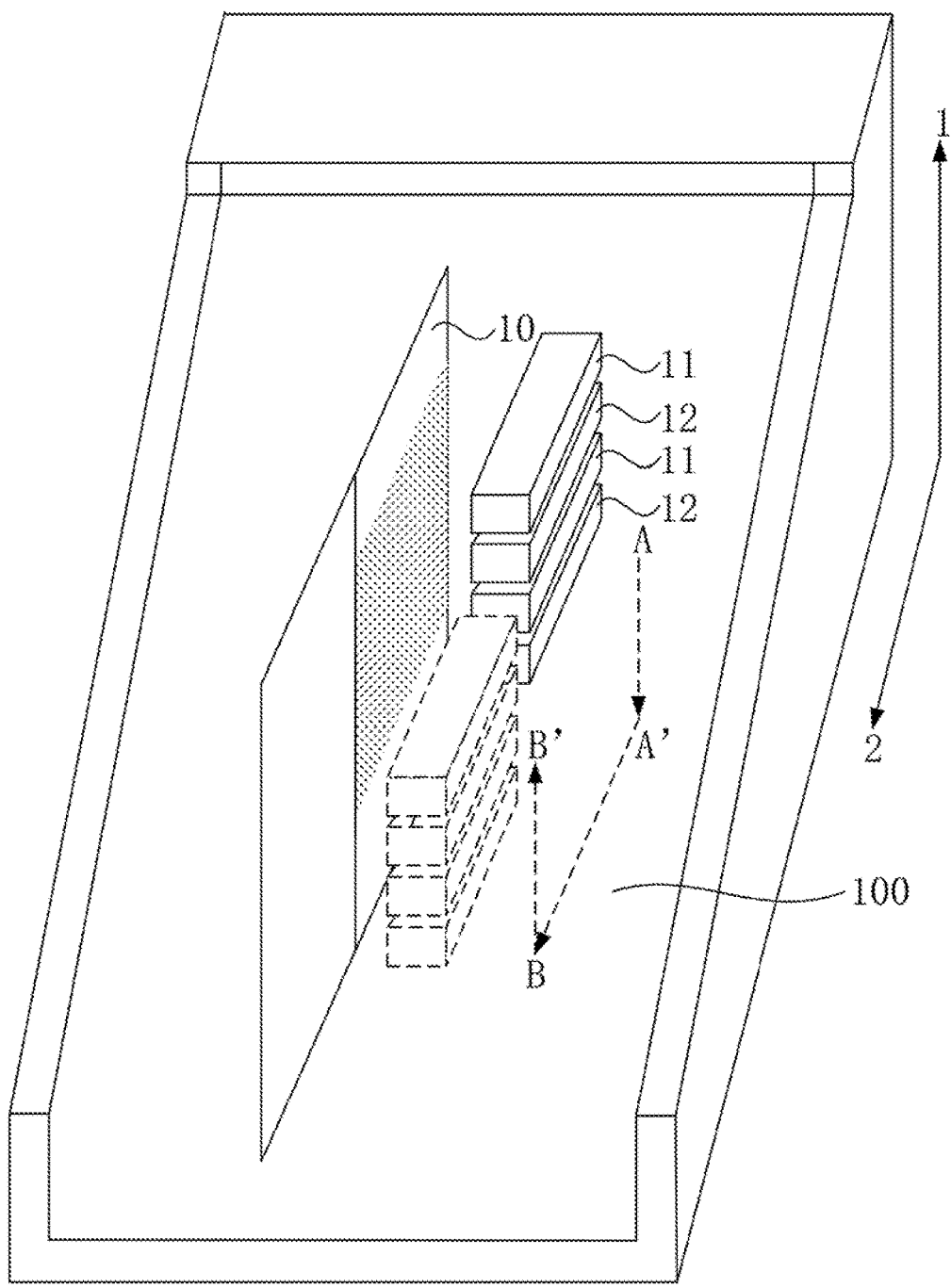
FIG. 5 illustrates a partial schematic inner view of another exemplary vacuum chamber of a vacuum evaporation device according to embodiments of the present disclosure.

FIG. 5 illustrates a partial schematic inner view of a vacuum chamber of another exemplary vacuum evaporation device according to embodiments of the present disclosure. As shown in FIG. 5, the first evaporation chamber 100 maintaining a vacuum may include a substrate 10, a plurality of first organic material evaporation sources 11 and a plurality of first metal evaporation sources 12. Different from aforementioned embodiments, the plurality of first organic material evaporation source 11 and the plurality of first metal evaporation sources 12 may be disposed alternately along the first direction 1.

In one embodiment, the plurality of first organic material evaporation source 11 and the plurality of first metal evaporation source 12 may be cuboid or linear-like evaporation sources. In particular, the first direction 1 may be a moving direction of the plurality of first organic material evaporation source 11 and the plurality of first metal evaporation source 12, and the second direction 2 may be an extension direction of the plurality of first organic material evaporation source 11 and the plurality of first metal evaporation source 12.

Further, the length of the linear-like evaporation source may be configured to be half of the length of the substrate 10 along the second direction 2. By alternately arranging the plurality of first organic material evaporation source 11 and the plurality of first metal evaporation source 12, the first organic material and the first metal material may be ensured to mix fully when co-evaporated. Accordingly, the components of the first organic material and the first metal material may be more uniform in the formed film layer.

Figure 6:
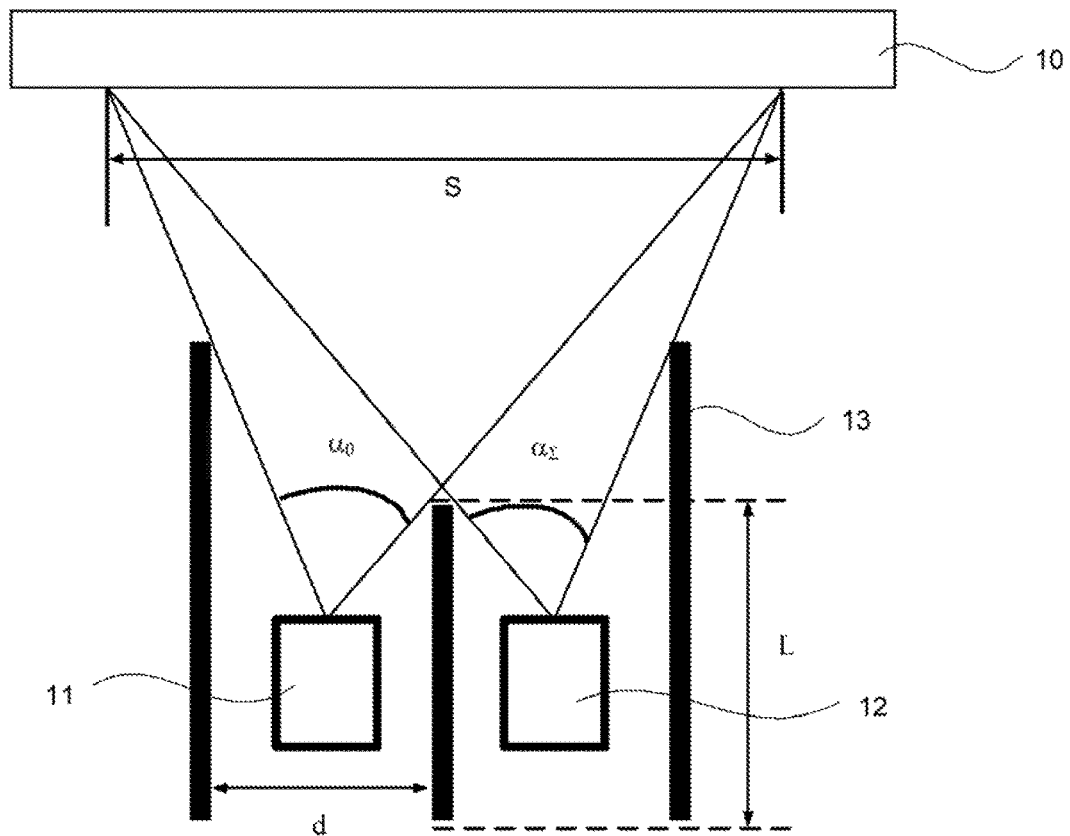
FIG. 6 illustrates a schematic view of positions of a first organic material evaporation source and a first metal evaporation source according to embodiments of the present disclosure.

FIG. 6 illustrates a schematic view of positions of a first organic material evaporation source and a first metal evaporation source according to embodiments of the present disclosure. As shown in FIG. 6, one first organic material evaporation source 11 and one first metal evaporation source 12 are illustrated. Angle boards 13 may be disposed on two side of each of the first organic material evaporation source 11 and the first metal evaporation source 12 along the moving direction.

Further, under the effect of the angle boards 13 on the two sides of each evaporation source, the first organic material ejected by the first organic material evaporation source 11 may form a first evaporation angle $\alpha_1$ of a sectorial-shape in a tangent-plane. Similarly, the first metal material ejected by the first metal evaporation source 12 may form a second evaporation angle $\alpha_2$ of a sectorial-shape in a tangent-plane. Optionally, by adjusting the positions and shapes of the angle boards and the evaporation sources, the corresponding evaporation angles (e.g., the first evaporation angle $\alpha_1$ and the second evaporation angle $\alpha_2$) may be adjusted. For example, different angle boards may be configured to have different dimensions, thereby adjusting the evaporation angles.

Further, the evaporation planes on the substrate 10 corresponding to the first evaporation angle $\alpha_1$ and the second evaporation angle $\alpha_2$ may coincide, and the area of the evaporation planes may be S. The angle planes 13 may be able to partially block the first organic material and the first metal material ejected by the first organic material evaporation source 11 and the first metal evaporation source 12, respectively. Accordingly, by adjusting a distance d between two adjacent angle plates 13, a length L of the angle plates 13, and positions of the first organic material evaporation source 11 and the first metal evaporation source 12, the evaporation area S corresponding to the two evaporation sources (i.e., the first organic material evaporation source 11 and the first metal evaporation source 12) on the substrate 10 may be controlled.

Further, the first evaporation angle $\alpha_1$ and the second angle $\alpha_2$ may be the same, or may be different, as long as the evaporation planes corresponding to the first evaporation angle $\alpha_1$ and the second evaporation angle $\alpha_2$ are coincided. As shown in FIG. 6, the evaporation planes of the first organic material and the first metal material ejected by the first organic material evaporation source 11 and the first metal evaporation source 12 may coincide, thereby preventing the occurrence of single-material film layers including only the first organic material or the first metal material. Accordingly, the uniformity of the film layer comprising a blend of the first organic material and the first metal material may be enhanced.

Figure 7:
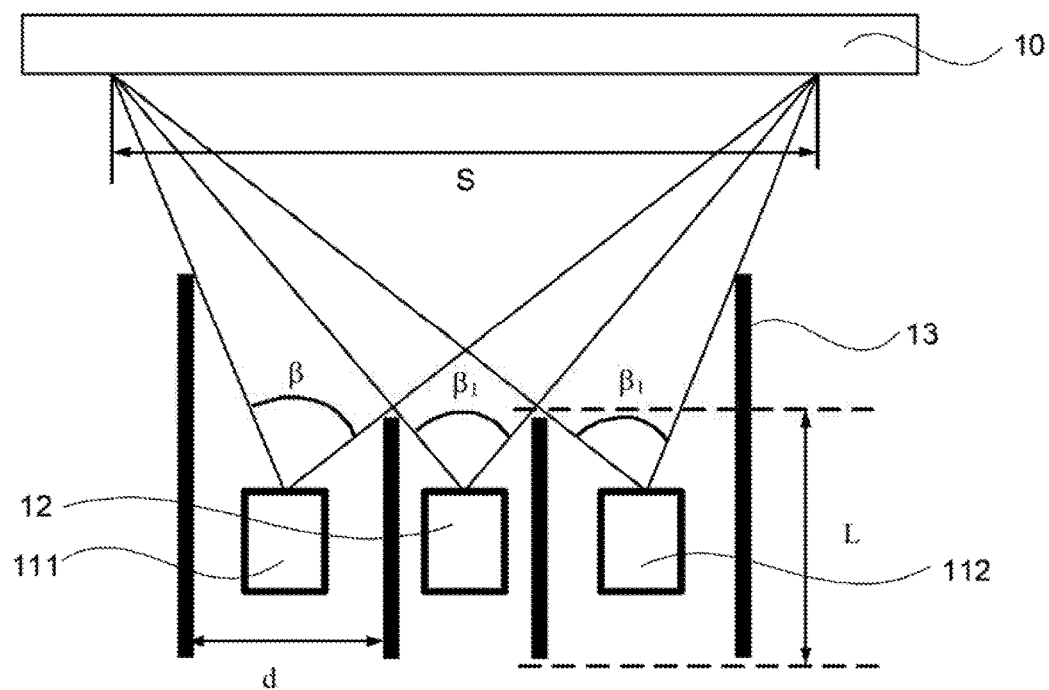
FIG. 7 illustrates another schematic view of positions of two first organic material evaporation source and one first metal evaporation source according to embodiments of the present disclosure.

Similarly, when a plurality of evaporation sources is applied, the evaporation planes corresponding to the evaporation angles of each of the plurality of evaporation sources may still be coincided by adjusting the angle plates 13. FIG. 7 illustrates a schematic view of positions of two first organic material evaporation source and one first metal evaporation source according to embodiments of the present disclosure. As shown in FIG. 7, two first organic material evaporation sources 111 and 112 and one first metal evaporation source 12 are disposed, and the first metal evaporation source 12 may be disposed between the two first organic material evaporation sources 111 and 112.

Further, an angle plate 13 may be disposed on each side of each evaporation source along the moving direction. A first evaporation angle formed by the first organic material evaporation source 111 may be β1, a second evaporation angle formed by the first metal evaporation source 12 may be β2, and a third evaporation angle formed by first organic material evaporation source 112 may be β3. By adjusting the distance d between the angle plates 13 on two sides of each evaporation source, the length L of the angle plates 13, and the positions of each evaporation source, the evaporation planes corresponding to the first, second, and third evaporation angles β1, β2, and β3 may be coincided, and the area of the evaporation planes may be S. Accordingly, a film layer comprising a blend of first organic material and the first metal material may be formed uniformly on the substrate 10.

Optionally, a material evaporated by the first organic material evaporation source 111 or 112 may include an electron-type (also known as n-type) auxiliary light-emitting material. In one embodiment, evaporated by the first organic material evaporation source, the n-type auxiliary light-emitting material may form at least one layer of an electron injection layer, an electron transport layer, and a hole barrier layer, etc. The n-type light-emitting material may have functions such as accelerating the injection rate and transport rate of electrons, and blocking the injection and transport of holes. The n-type light-emitting material may also form a stack structure of an electron injection layer, an electron transport layer, and a hole barrier layer via evaporation of the first organic material evaporation source.

Further, a plurality of first organic material evaporation sources and a plurality of first metal evaporation sources may be disposed in the first evaporation chamber, thereby implementing the formation of film layers of the electron injection layer, the electron transport layer, and the hole barrier layer, etc. in the same chamber. Further, a plurality of first evaporation chambers may be disposed in the vacuum evaporation device. The electron injection layer, the electron transport layer, and the hole barrier layer may thus be fabricated in different first evaporation chambers, respectively.

Optionally, the n-type auxiliary light-emitting material may include at least a first functional group. The first functional group may be a conjugated structure including at least three consecutive benzene rings, and at least one carbon atom in the three consecutive benzene rings is replaced by a nitrogen atom. Further, the first functional group may be an axisymmetric structure. For example, a general structure of the first functional group may be as follows:

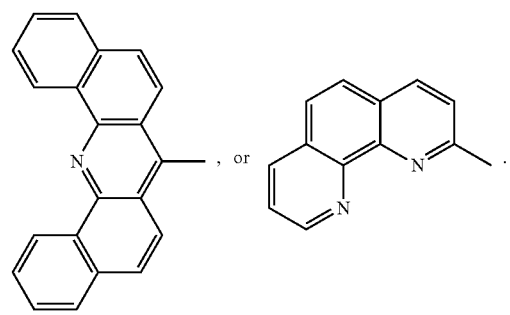 [SMILES: Cc1c2ccc3ccccc3c2nc2c1ccc1ccccc12 ; Cc1ccc2ccc3cccnc3c2n1]

Optionally, a material to be evaporated by the first metal evaporation source may include at least one element selected from main group II, main group III, and rare earth elements. For example, the material to be evaporated by the first metal evaporation source 12 may be at least one of Yb, Mg, and LiF. For example, the first metal evaporation source 12 may evaporate Yb to form a film layer with a relatively high electron mobility.

Optionally, based on the aforementioned embodiments, the vacuum evaporation device may further include a second evaporation chamber. The second evaporation chamber may include a second organic light-emitting material evaporation source configured to evaporate a second organic light-emitting material. In one embodiment, the second organic light-emitting material may be, for example, evaporated by the second organic light-emitting material evaporation source to form a light-emitting material layer in an organic electroluminescent device. The present disclosure is not intended to limit the number of second evaporation chambers and the number of second organic light-emitting material evaporation sources in the vacuum evaporation device.

For example, if a process requires that light-emitting material layers corresponding to three light-emitting color pixel regions of red, green, and blue are to be formed via evaporation, because the light-emitting material layer corresponding to each light-emitting color pixel region needs a mask with a corresponding color, three second evaporation chambers may be needed in the vacuum evaporation device. Each second evaporation chamber may be configured with one second organic light-emitting material evaporation source. Each second organic light-emitting material evaporation source may be configured to evaporate a light-emitting material layer corresponding to a corresponding light-emitting color pixel region. By controlling the movement speed of each second organic light-emitting material evaporation source in a film-forming direction, the film thickness uniformity of each light-emitting material layer may be improved.

Optionally, based on the aforementioned embodiments, the vacuum evaporation device may further include a third evaporation chamber, and the third evaporation chamber may include a second metal evaporation source configured to evaporate the second metal material. In one embodiment, the second metal material may be, for example, evaporated by the second metal evaporation source to form a cathode in an organic electroluminescent device. The present disclosure is not intended to limit the number of the third evaporation chambers and the number of the second metal evaporation sources in the vacuum evaporation device.

For example, a cathode film layer may be formed by using a second metal evaporation source to evaporate a metal material such as Mg or Ag. Optionally, two second metal evaporation sources may be configured in the third evaporation chamber, where one second metal evaporation source is configured to evaporate the Mg metal material, and one second metal evaporation source is configured to evaporate the Ag metal material. The two second metal evaporation sources may both be linear-like evaporation sources, or may be both point-like evaporation sources, or may be a combination of a linear-like evaporation source and a point-like evaporation source. Further, the two second metal evaporation sources may move simultaneously along the film-forming direction, thereby forming a uniform cathode film layer of two metallic materials.

Optionally, based on the aforementioned embodiments, a vacuum evaporation chamber may further include a fourth evaporation chamber, and the fourth evaporation chamber may include a third organic material evaporation source configured to evaporate a third organic material. The third organic material may include a p-type auxiliary light-emitting material. The present disclosure is not intended to limit the number of the fourth evaporation chambers and the number of the third organic material evaporation sources in the vacuum evaporation device. In one embodiment, the third organic light-emitting material may be, for example, evaporated by the third organic material evaporation source to form the p-type auxiliary light-emitting layer.

The p-type auxiliary light-emitting layer may, for example, be a film layer such as a hole injection layer, a hole transport layer, and an electron-blocking layer, thereby having a function of enhancing hole transfer and blocking electron transport. For example, three third organic material evaporation sources may be disposed in the fourth evaporation chamber and configured to evaporate and form film layers such as the hole injection layer, the hole transport layer, and the electron-blocking layer, etc. respectively. By controlling the movement speed of each third organic material evaporation source along a film-forming direction, the film thickness uniformity of each p-type auxiliary light-emitting layer may be improved.

Optionally, a plurality of fourth evaporation chambers may be disposed in the vacuum chamber device, and the hole injection layer, the hole transport layer, and the electron barrier layer may be fabricated using different fourth evaporation chambers. Those skilled in the art should understand that materials forming the hole injection layer, the hole transport layer, and the electron barrier layer in the aforementioned embodiments of the present disclosure may be the same, or may be different. The present disclosure is not intended to be limiting, depending on specific situations.

Similarly and optionally, based on the aforementioned embodiments, the vacuum evaporation device may further include a fifth evaporation chamber, and the fifth evaporation chamber may include a fourth organic material evaporation source configured to evaporate a fourth organic material. The fourth organic material may include a n-type auxiliary light-emitting material. The present disclosure is not intended to limit the number of the fifth evaporation chambers and the number of the fourth organic material evaporation sources in the vacuum evaporation device.

In one embodiment, the fourth organic light-emitting material may be, for example, evaporated by the fourth organic material evaporation source to form the n-type auxiliary light-emitting layer. The n-type auxiliary light-emitting layer may be, for example, a film layer such as an electron injection layer, an electron transport layer, and a hole barrier layer, etc. By controlling the movement speed of each fourth organic material evaporation source in a film-forming direction, the film thickness uniformity of each n-type auxiliary light-emitting layer may be improved.

Optionally, a plurality of fifth evaporation chambers may be configured in the vacuum evaporation chamber, and the electron injection layer, the electron transport layer, and the hole barrier layer may be fabricated using different fifth evaporation chambers. Those skilled in the art should understand that the materials forming the electron injection layer, the electron transport layer, and the hole barrier layer in the aforementioned embodiments of the present disclosure may be the same, or may be different. The present disclosure is not intended to be limiting, depending on specific conditions.

Based on the aforementioned descriptions, the present disclosure also provides a vacuum evaporation method, and the method may include controlling at least one first organic material evaporation source and at least one first metal evaporation source in a first evaporation chamber to perform evaporation simultaneously, thereby implementing blend doping of a first organic material and a first metal material.

By controlling the at least one first organic material evaporation source and the at least one first metal evaporation source in the first evaporation chamber to perform evaporation simultaneously, the present disclosure may implement blend evaporation of the first organic material and the first metal material in the same chamber of the vacuum evaporation device.

Optionally, the evaporation temperature difference between the first organic material evaporation source and the first metal evaporation source may be smaller than or equal 15 to 300° C. If the temperature difference between the first organic material evaporation source and the first metal evaporation source is too large, an excessive evaporation temperature of the first metal material may severely affect an evaporation rate of the first organic material. For example, a range of the evaporation temperature of the first organic material may be approximately 100° C.~400° C., and a range of the evaporation temperature of the first metal material may be approximately 200° C.~400° C. Accordingly, the maximal temperature difference between the first organic material evaporation source and the first metal evaporation source may be controlled to be less than approximately 300° C.

In one embodiment, the n-type auxiliary light-emitting layer of the organic electroluminescent device may often include an electron transport layer. To enhance an electron mobility in the n-type auxiliary light-emitting layer, the electron transport layer may often be doped with a metal Yb. Further, the vacuum evaporation device provided by embodiments of the present disclosure may be applied. In the first evaporation chamber, the first organic material evaporation source may be used to evaporate the electron transport layer material, and the first metal evaporation source may be used to evaporate a Yb metal material. Further, the first organic material evaporation and the first metal evaporation source may be controlled to move simultaneously along a film-forming direction, thereby forming a uniform film layer comprising a blend of an electron transport layer material and the Yb metal material.

Further, an evaporation temperature of the electron transport layer material may be often in a range of approximately 100° C.~400° C., and when in a vacuum device with a relatively high vacuum degree, the Yb metal material may evaporate in a temperature range of approximately 200° C.~400° C. Accordingly, when the first organic material evaporation source is used to evaporate the electron transport layer material and the first metal evaporation source is used to evaporate the Yb metal material to form an n-type auxiliary light-emitting layer, an evaporation temperature difference between the first organic material evaporation source and the first metal evaporation source may be smaller than or equal to 300° C.

Optionally, the evaporation temperature difference between the first organic material evaporation source and the first metal evaporation source may be smaller than or equal to 200° C. Similarly, if the evaporation temperature difference between the first organic material evaporation source and the first metal evaporation source is too large, the excessive evaporation temperature of the first metal material may severely affect the evaporation rate of the first organic material. The smaller the difference between the evaporation temperatures of the first organic material evaporation source and the first metal evaporation source, the smaller the mutual influence on the evaporation temperature, thus facilitating the control of the thermal processing conditions when vacuum evaporation is performed.

In one embodiment, the first organic material evaporation source may be used to evaporate the electron transport layer material, and the first metal evaporation source may be used to evaporate the Yb metal material. The evaporation temperature of the Yb metal material may be related to the doping concentration, and the higher the doping concentration, the higher the evaporation temperature needed. To improve the light-emitting performance of an organic electroluminescent device, the doping concentration of the Yb metal material may be approximately 1%, and the corresponding evaporation temperature of Yb in a vacuum state may be approximately 280° C. Further, different organic electron transport layer materials may have different evaporation temperatures. The evaporation temperature of most electron transport layer materials may be in a range of approximately 150° C.~350° C., such that the evaporation temperature difference between the electron transport layer material and the Yb metal material may be controlled to be less than approximately 200° C.

Optionally, a substrate is fixedly disposed in the first evaporation chamber. At least one organic material evaporation source and at least one first metal evaporation source may be arranged facing towards the substrate, and the at least one first organic material evaporation source and the at least one first metal evaporation source may be controlled to move from an edge of the substrate to another edge of the substrate. In one embodiment, the one first organic material evaporation source and the one first metal evaporation source may be arranged relatively, and the first organic material evaporation source and the first metal evaporation source may be both linear-like or cuboid evaporation sources.

Optionally, the first organic material evaporation source may be a linear-like evaporation source, and the first metal evaporation source may be a point-like evaporation source arranged relative to the first organic material evaporation source. Or, a plurality of first organic material evaporation sources and a plurality of first metal evaporation sources may be arranged relatively and alternately. The evaporation sources configured in the aforementioned conditions may all move from an edge of the substrate to another edge of the substrate, such that the edges of the substrate may also be covered by an evaporation film layer comprising a uniform blend of the first organic material and the first metal material.

Optionally, at least one first organic material evaporation source and at least one first metal evaporation source may be arranged in parallel along the moving direction, and the at least one first organic material evaporation source and the at least one first metal evaporation source may be controlled to move simultaneously in the same direction. Thus, the control and operation of the first organic material evaporation source and the first metal evaporation source in the first vacuum chamber may become more convenient, and the film formed by the first organic material and the first metal material may be more uniform.

Figure 8:
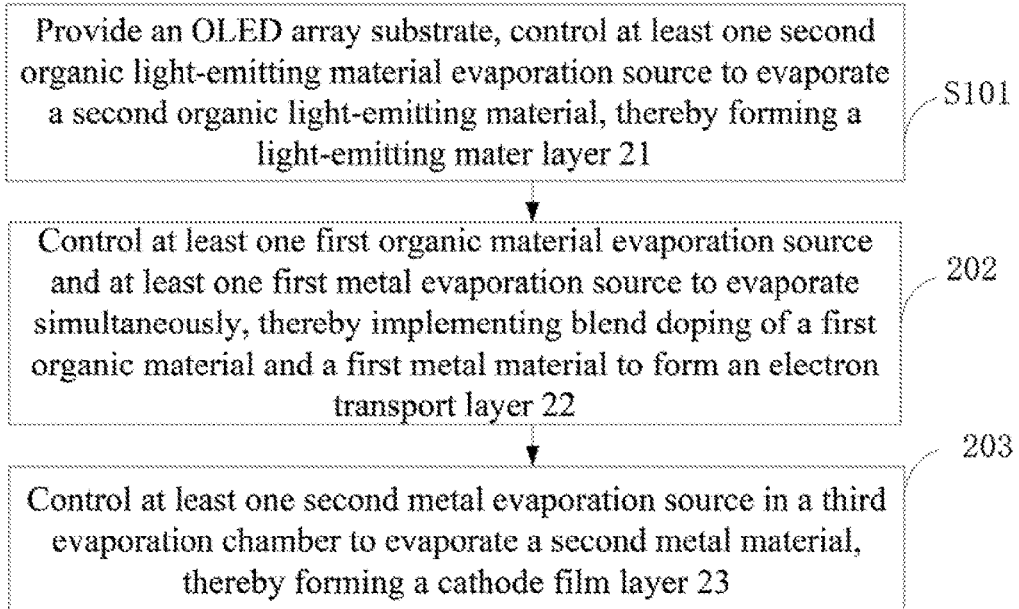
FIG. 8 illustrates an exemplary flow chart of a vacuum evaporation method according to embodiments of the present disclosure.
Figure 9A:
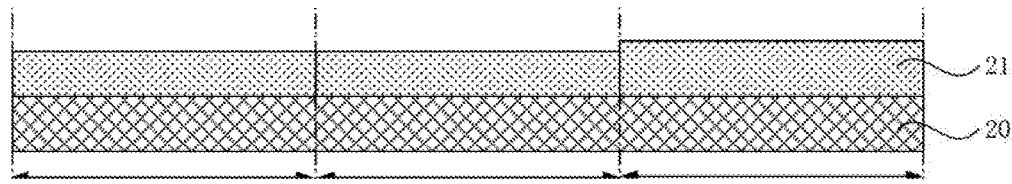
FIGS. 9A-9C illustrate cross-sectional schematic views corresponding to each step in FIG. 8 according to embodiments of the present disclosure.
Figure 9B:
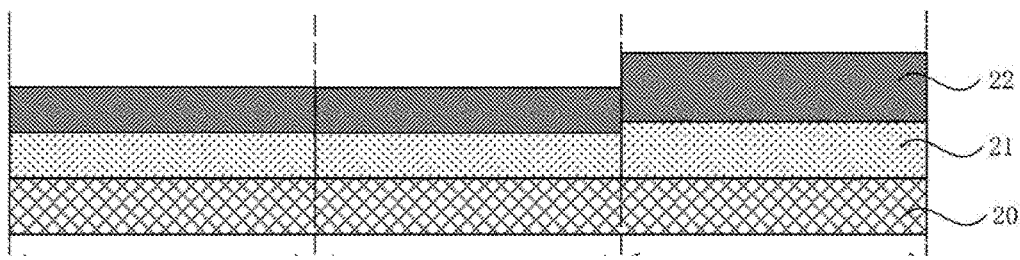
Figure 9C:
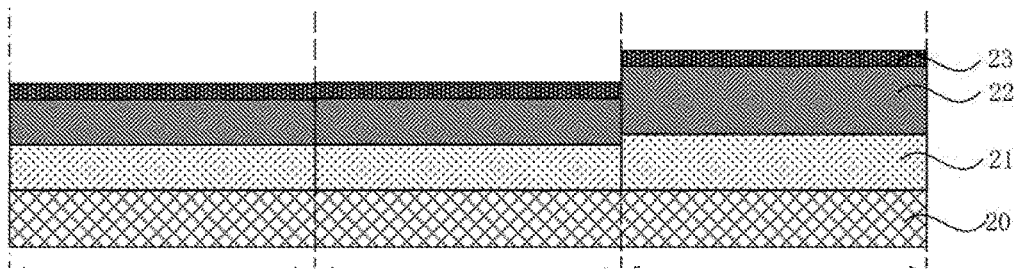

FIG. 8 illustrates an exemplary flow chart of a vacuum evaporation method according to embodiments of the present disclosure. FIGS. 9A-9C illustrate cross-sectional schematic views corresponding to each step in FIG. 8. For example, in one embodiment, the vacuum evaporation device may further include at least a second evaporation chamber and at least a third evaporation chamber.

The second evaporation chamber may include at least one second organic light-emitting material evaporation source, and the at least one second organic light-emitting material evaporation source may be configured to evaporate the second organic light-emitting material. The third evaporation chamber may include at least one second metal evaporation source, and the at least one second metal evaporation source may be configured to evaporate the second metal material.

As shown in FIG. 8 and referring to FIG. 9A, the method may include providing an OLED array substrate, and controlling at least one second organic light-emitting material evaporation source in a second evaporation chamber to evaporate a second organic light-emitting material, thereby forming a light-emitting material layer 21 (Step S101).

In one embodiment, the second organic light-emitting material evaporation source may be a linear-like evaporation source, and when the second organic light-emitting material is evaporated, the second organic light-emitting material evaporation source may move from an edge of the substrate to another edge of the substrate, thereby forming the second organic light-emitting material layer. In one embodiment, the second organic light-emitting material evaporation source in the second evaporation chamber may be used to evaporate the light-emitting material layer in the organic electroluminescent device.

Referring to FIG. 9A, a light-emitting material layer 21 may be formed on an OLED array substrate 20 via evaporation of the second organic light-emitting material evaporation source. The present disclosure is not intended to limit the number of the second evaporation chambers. For example, three second evaporation chambers may be used, and the second organic light-emitting evaporation source in each evaporation chamber may be configured to evaporate light-emitting material layers 21 in a blue light-emitting color pixel region (A1), a green light-emitting color pixel region (A2), and a red light-emitting color pixel region (A3), respectively. In particular, the thickness of the light-emitting material layers 21 corresponding to each pixel region may be the same, or may be different.

For example, FIG. 9A illustrates a situation where the thickness of the light-emitting material layer 21 in the red light-emitting color pixel region (A3) is different from the thickness of the light-emitting material layers 21 in other two pixel regions. In addition, the number of the second organic light-emitting material evaporation sources in each second evaporation chamber may not be limited. Each second organic light-emitting material evaporation source in the same chamber may be solely evaporated, or may be co-evaporated to realize blend doping.

The vacuum evaporation method may further include controlling at least one first organic material evaporation source and at least one first metal evaporation source in the first evaporation chamber to perform evaporation simultaneously, thereby implementing the blend doping of the first organic material and the first metal material to form an electron transport layer 22 (Step S102).

In one embodiment, the n-type auxiliary light-emitting layer in an organic electroluminescent device may be evaporated using the first evaporation chamber. Referring to FIG. 9B, an electron transport layer material may be configured in the first organic material evaporation source, and a first metal material may be configured in the first metal evaporation source (e.g., a Yb metal material). The first organic material evaporation source and the first metal evaporation source may be controlled to evaporate simultaneously, thereby forming the electron transport layer 22 doped with the Yb metal material. Accordingly, the electron mobility of the electron transport layer 22 may be enhanced.

In one embodiment, to improve the performance of the organic electroluminescent device, the thickness of the electron transport layers in each pixel region may be the same, or may be different. Further, by configuring angle plates on two sides of each of the first organic material evaporation source and the first metal evaporation source and adjusting the evaporation planes corresponding to the evaporation angles to be coincided, the film layer may be formed uniformly.

Further, the vacuum evaporation method may further include controlling at least one second metal evaporation source in a third evaporation chamber to evaporate a second metal material, thus forming a cathode film layer 23 (Step S103).

In one embodiment, the cathode film layer 23 in the organic electroluminescent device may be evaporated using the third evaporation chamber. Referring to FIG. 9C, the cathode film layer 23 may be formed through evaporation of the Mg or Ag metal material by the second metal evaporation source. Optionally, the cathode film layer 23 may be formed through co-evaporation of the Mg and Ag metal materials.

For example, two second metal evaporation sources may be disposed in the third evaporation chamber, where one second metal evaporation source is configured to evaporate the Mg metal material, and one second metal evaporation source is configured to evaporate the Ag metal material. Further, in one embodiment, the cathode film layer 23 comprising a blend of Mg and Ag may have a Mg-to-Ag ratio of approximately 10:1 and a thickness of approximately 15 nm.

In one implementation method of the present disclosure, a vacuum evaporation device may further include at least a fourth evaporation chamber. The fourth evaporation chamber may include at least one third organic material evaporation source, and the at least one third organic material evaporation source may be configured to evaporate a third organic material. The third organic material may include a p-type auxiliary light-emitting material.

Optionally, before Step S101, the vacuum evaporation method may further include controlling at least one third organic material evaporation source in the fourth evaporation chamber to evaporate the third organic material. The third organic material may include a p-type auxiliary light-emitting material. For example, the p-type auxiliary light-emitting material may include one or more of a hole injection layer material, a hole transport layer material, and an electron barrier layer material.

In another implementation method of the present disclosure, the vacuum evaporation device may further include at least a fifth evaporation chamber. The fifth evaporation chamber may include at least one fourth organic material evaporation source. The at least one fourth organic material evaporation source may be configured to evaporate a fourth organic material. The fourth organic material may include a n-type auxiliary light-emitting material.

Similarly and optionally, before Step S103, the vacuum evaporation method may further include controlling at least one fourth organic material evaporation source in the fifth evaporation chamber to evaporate the fourth organic material. The fourth organic material may include an n-type auxiliary light-emitting material. For example, the aforementioned n-type auxiliary light-emitting material may include one or more of the electron injection layer material, the electron transport layer material, and the hole barrier layer material. Further, the present disclosure is not intended to limit the order of the fifth evaporation chamber and the first evaporation chamber being used, and the specific order may be adjusted according to the structure of the OLED device.

By controlling at least one first organic material evaporation source and at least one first metal evaporation source in the first evaporation chamber to perform evaporation simultaneously, embodiments of the present disclosure may implement uniform blend doping of the first organic material and the first metal material.

Figure 10:
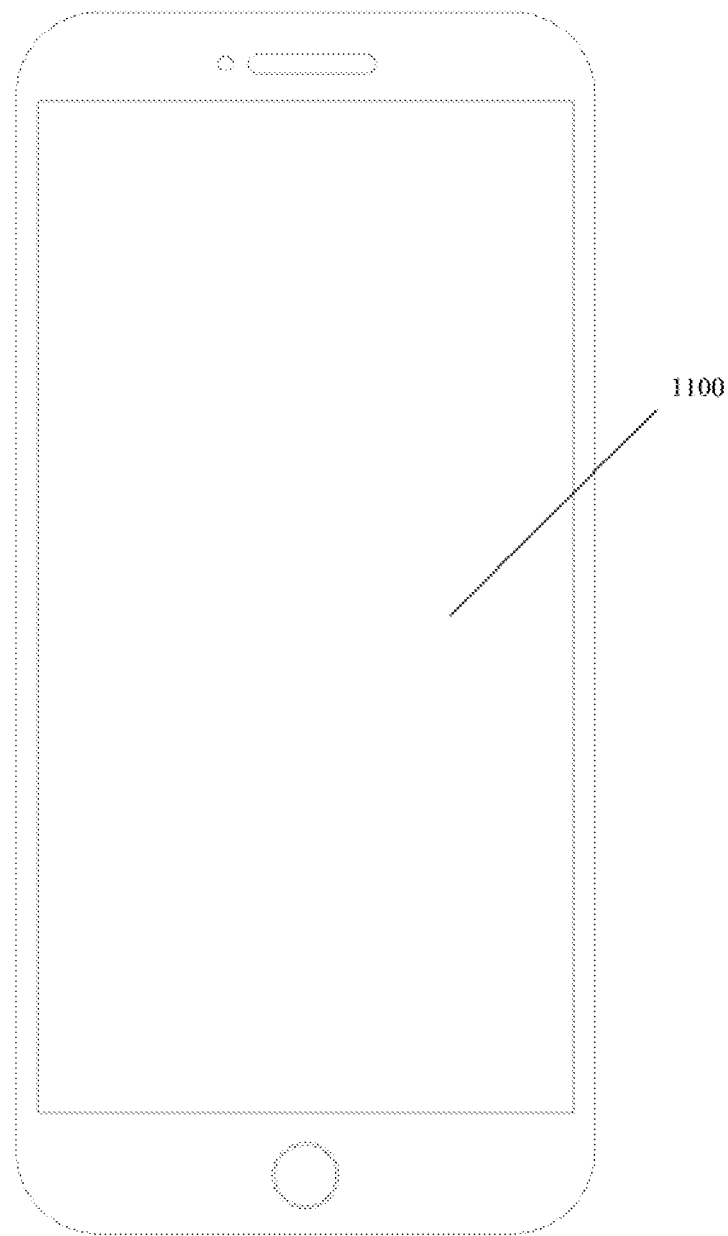
FIG. 10 illustrates an exemplary organic light-emitting display panel according to embodiments of the present disclosure.

The present disclosure also provides an organic light-emitting display panel. FIG. 10 illustrates an exemplary organic light-emitting display panel according to embodiments of the present disclosure. As shown in FIG. 10, in one embodiment, an organic light-emitting display panel 1100 may be applied to a mobile phone. In some other embodiments, the organic light-emitting display panel 1100 may be applied to other products, devices or units having a display function, such as a notebook, a tablet computer, or a display monitor, etc.

Further, the organic light-emitting display panel 100 may be formed using a vacuum evaporation method described in aforementioned embodiments. Accordingly, the disclosed display panel provided by embodiments of the present disclosure may also have advantages mentioned in aforementioned embodiments, which is not repeatedly described herein. Further, any product or component having a display function, such as a mobile phone, a notebook, a tablet computer, or a display monitor, etc.

As such, embodiments of the present disclosure provide a vacuum evaporation device, a method thereof, and an organic light-emitting display panel. By configuring at least one first organic material evaporation source and at least one first metal evaporation source in the first evaporation chamber, the at least one first organic material evaporation source and the at least one first metal evaporation source may be controlled to evaporate simultaneously, and the blending of the first organic material and the first metal material may be implemented. In particular, the first organic material evaporation chamber is configured to evaporate a first organic material, and the first metal evaporation source is configured to evaporate a first metal material.

For example, when an electron transport layer of an organic light-emitting display panel is fabricated, an electron mobility of the electron transport layer may be enhanced by co-evaporation of the organic material and the metal material. Embodiments of the present disclosure may precisely control the first organic material evaporation source and the first metal evaporation source, respectively, thereby implementing uniform blending of the first organic material and the first metal material.

It should be noted that, aforementioned descriptions are merely preferred embodiments and technical principles applied herein. Those skilled in the art may understand that the present disclosure is not limited to specific embodiments described herein, and various variations, adjustments and replacements may be readily obtained by those skilled in the art without departing from the protection scope of the present disclosure. Thus, though the present disclosure has been illustrated in a relatively detailed manner by using the above embodiments, the present disclosure is not limited to the above embodiments and may include more other equivalent embodiments without departing from the spirit of the present disclosure. The scope of the present disclosure is determined by the range of appended claims.

What is claimed is:

1. A vacuum evaporation device, comprising:
   at least a first evaporation chamber, wherein:
   the first evaporation chamber includes at least one first organic material evaporation source and at least one first metal evaporation source,
   the at least one first organic material evaporation source is configured to evaporate a first organic material,
   the at least one first metal evaporation source is configured to evaporate a first metal material, and
   the at least one first organic material evaporation source and the at least one first metal evaporation source are controlled to perform evaporation simultaneously to generate blend doping of the first organic material and the first metal material on a substrate disposed within the first evaporation chamber,
   wherein a material configured to be evaporated by the at least one first metal evaporation source includes at least one element selected from main group II and main group III, and rare earth elements,
   the material configured to be evaporated by the at least one first metal evaporation source includes at least one of ytterbium (Yb), magnesium (Mg), and lithium fluoride (LiF), and
   an evaporation temperature difference between the at least one first organic material evaporation source and the at least one first metal evaporation source is smaller than or equal to 300° C.

2. The vacuum evaporation device according to claim 1, wherein:
   the at least one first organic material evaporation source and the at least one first metal evaporation source are cuboid evaporation sources.

3. The vacuum evaporation device according to claim 1, wherein:
   the at least one first organic material evaporation source is a cuboid evaporation source, and the at least one first metal evaporation source includes at least one point-like evaporation source.

4. The vacuum evaporation device according to claim 3, wherein:
   the first evaporation chamber includes a plurality of first metal evaporation sources, and
   the plurality of metal evaporation sources are arranged in parallel along an extension direction of the first organic material evaporation source.

5. The vacuum evaporation device according to claim 1, wherein:
   the at least one first organic material evaporation source and the at least one first metal evaporation source are arranged in parallel along a moving direction and are able to move simultaneously in a same direction.

6. The vacuum evaporation device according to claim 5, wherein:
   the at least one first organic material evaporation source and the at least one metal evaporation source are arranged alternately along the moving direction.

7. The vacuum evaporation device according to claim 1, wherein:
   an angle plate is disposed on each of two sides of the at least one first organic material evaporation source and the at least one first metal evaporation source along a moving direction, and evaporation planes corresponding to angle plates of the at least one first organic material evaporation source and the at least one first metal evaporation source are coincided.

8. The vacuum evaporation device according to claim 1, wherein:
   a material configured to be evaporated by the at least one first organic material evaporation source includes an n-type auxiliary light-emitting material.

9. The vacuum evaporation device according to claim 8, wherein:
   the n-type auxiliary light-emitting material includes at least a first functional group, and
   the first functional group is a conjugated structure including at least three consecutive benzene rings, at least one carbon atom in the three consecutive benzene rings is replaced by a nitrogen atom, and the first functional group is an axisymmetric structure.

10. The vacuum evaporation device according to claim 8, wherein:
    evaporated by the at least one first organic material evaporation source, the n-type auxiliary light-emitting material forms at least one layer of an electron injection layer, an electron transport layer, and a hole barrier layer; and
    the at least one layer of the electron injection layer, the electron transport layer, and the hole barrier layer is a uniform film layer comprising the blend of the first organic material and the first metal material on the substrate.

11. The vacuum evaporation device according to claim 8, wherein:
    evaporated by the at least one first organic material evaporation source, the n-type light-emitting material forms a stack structure of an electron injection layer, an electron transport layer, and a hole barrier layer.

12. The vacuum evaporation device according to claim 1, further comprising:
    at least a second evaporation chamber including at least one second organic light-emitting material evaporation source, wherein the at least one second organic light-emitting material evaporation source is configured to evaporate a second organic light-emitting material; and
    at least a third evaporation chamber including at least one second metal evaporation source, wherein the at least one second metal evaporation source is configured to evaporate a second metal material.

13. The vacuum evaporation device according to claim 12, further comprising:
    at least a fourth evaporation chamber including at least one third organic material evaporation source,
    wherein the at least one third organic material evaporation source is configured to evaporate a third organic material and the third organic material includes a p-type auxiliary light-emitting material.

* * * * *